United States Patent
Wang et al.

(10) Patent No.: US 10,642,170 B2
(45) Date of Patent: May 5, 2020

(54) ANGLE ADJUSTMENT TOOL, ANGLE ADJUSTMENT SYSTEM FOR LIQUID CRYSTAL PANEL AND LINE DEFECT ANALYSIS METHOD

(71) Applicants: BOE TECHNOLOGY GROUP CO., LTD., Beijing (CN); BEIJING BOE DISPLAY TECHNOLOGY CO., LTD., Beijing (CN)

(72) Inventors: Zhe Wang, Beijing (CN); Yuanchao Zhu, Beijing (CN); Guoyu Qiao, Beijing (CN); Fei Ma, Beijing (CN); Chen Qi, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 235 days.

(21) Appl. No.: 15/743,555

(22) PCT Filed: Jul. 17, 2017

(86) PCT No.: PCT/CN2017/093130
§ 371 (c)(1),
(2) Date: Jan. 10, 2018

(87) PCT Pub. No.: WO2018/126637
PCT Pub. Date: Jul. 12, 2018

(65) Prior Publication Data
US 2019/0361364 A1 Nov. 28, 2019

(30) Foreign Application Priority Data

Jan. 4, 2017 (CN) .......................... 2017 1 0004752

(51) Int. Cl.
*G01B 11/00* (2006.01)
*G03F 9/00* (2006.01)
(Continued)

(52) U.S. Cl.
CPC ......... *G03F 9/7019* (2013.01); *G01N 21/956* (2013.01); *G01N 21/958* (2013.01); *G03F 9/7015* (2013.01)

(58) Field of Classification Search
CPC ...... F16M 13/022; F16M 11/06; F16M 11/10; F16M 11/38; F16M 11/2014;
(Continued)

(56) References Cited

U.S. PATENT DOCUMENTS 9,360,776 B2     6/2016 Nomura et al.
2006/0027289 A1* 2/2006 Lin ........................ B27G 5/023
                                                          144/286.1
(Continued)

FOREIGN PATENT DOCUMENTS

CN     1566971 A     1/2005
CN     103733138 A   4/2014
(Continued)

OTHER PUBLICATIONS

International Search Report and Written Opinion dated Sep. 27, 2017, for corresponding PCT Application No. PCT/CN2017/093130.

*Primary Examiner* — Mesfin T Asfaw
(74) *Attorney, Agent, or Firm* — Kinney & Lange, P.A.

(57) ABSTRACT

An angle adjustment tool, an angle adjustment system for a liquid crystal panel and a corresponding line defect analysis method are disclosed. The angle adjustment tool includes: a base; a first toothed member and a second toothed member; a rotating scale; and an angle indicator. The first toothed member includes a first toothed portion. A first end of the
(Continued)

second toothed member has a second toothed portion and engages with the first toothed portion of the first toothed member, and a second end of the second toothed member is connected to the rotating scale; the second toothed member is pivotable about a central pivot axis of the second toothed portion. A pitch circle diameter of the second toothed portion is n times a pitch circle diameter of the first toothed portion, where n is a positive integer greater than or equal to 2.

20 Claims, 3 Drawing Sheets

(51) Int. Cl.
*G01N 21/956* (2006.01)
*G01N 21/958* (2006.01)

(58) Field of Classification Search
CPC ............. F16M 11/125; F16M 11/2064; F16M 11/425; F16M 11/2007; F16M 11/2021; F16M 11/2035; B25B 23/0007; B25B 13/06; B25B 13/463; B25B 17/00
See application file for complete search history.

(56) References Cited

U.S. PATENT DOCUMENTS

| | | |
|---|---|---|
| 2006/0103843 A1 | 5/2006 | Chen et al. |
| 2014/0160494 A1 | 6/2014 | Kuba |

FOREIGN PATENT DOCUMENTS

| | | |
|---|---|---|
| CN | 103870067 A | 6/2014 |
| CN | 1036219242 A | 12/2016 |
| JP | H10301071 A | 11/1998 |

* cited by examiner

ANGLE ADJUSTMENT TOOL, ANGLE ADJUSTMENT SYSTEM FOR LIQUID CRYSTAL PANEL AND LINE DEFECT ANALYSIS METHOD

CROSS-REFERENCE TO RELATED APPLICATION

This application is a Section 371 National Stage Application of International Application No. PCT/CN2017/093130, filed on Jul. 17, 2017, entitled "ANGLE ADJUSTMENT TOOL, ANGLE ADJUSTMENT SYSTEM FOR LIQUID CRYSTAL PANEL AND DEFECT ANALYSIS METHOD", which claims priority to Chinese Patent Application No. 201710004752.9 filed on Jan. 4, 2017 with SIPO, incorporated herein by reference in entirety.

BACKGROUND

Technical Field

Embodiments of the present disclosure relate to a field of display technology or detection technology, and more particularly, to an angle adjustment tool, especially to an angle adjustment tool for defect analysis of TFT-LCD, which is used with a microscope, an angle adjustment system for a liquid crystal panel and a line defect analysis method.

Description of the Related Art

Currently, in the field of TFT-LCD (thin film transistor liquid crystal display), in a module production process, defective products are produced due to problems with the equipment or liquid crystal raw materials. The phenomenon may be divided into line defects and function defects. The line defect is one important defect of OLB (Outer Lead Bonding) project which needs to be analyzed. In the case of high incidence of online defects, the device may be adjusted timely or the liquid crystal panel raw materials may be fed back or improved if it can analyze reasons for line defects timely and effectively. In this way, it can solve essential questions, increase first pass yield of product and reduce costs.

SUMMARY

Embodiments of the present disclosure propose an angle adjustment tool.

In an aspect, the present disclosure provides an angle adjustment tool, including: a base; a first toothed member disposed on the base and a second toothed member engaged with the first toothed member; a rotating scale fixedly connected to the second toothed member; and an angle indicator connected to the first toothed member for indicating a rotation angle of the rotating scale, wherein the first toothed member includes a first toothed portion and the first toothed member is pivotable about a central pivot axis of the first toothed portion, wherein the second toothed member includes a second toothed portion, a first end of the second toothed member has the second toothed portion and engages with the first toothed portion of the first toothed member, and a second end of the second toothed member is connected to the rotating scale; the second toothed member is pivotable about a central pivot axis of the second toothed portion; and wherein a pitch circle diameter of the second toothed portion is n times a pitch circle diameter of the first toothed portion, where n is a positive integer greater than or equal to 2.

For example, an index plate having an angular scale is disposed above the base; the angle indicator is an adjusting lever, a first end of which is connected to the first toothed member and a second end of which is configured to indicate the angular scale on the index plate.

For example, the angle adjustment tool further includes an angle positioning mechanism for positioning a rotation angle of the rotating scale.

For example, the index plate is provided with a sectorial recess for rotation of the adjusting lever.

For example, the adjusting lever has a central hole; and the angle positioning mechanism includes a positioning hole arranged along a circumferential side wall of the sectorial recess; and a top bead mounted in the central hole and elastically abutting against the circumferential side wall of the sectorial recess.

For example, a protrusion for mounting the adjusting lever is provided in the first toothed member at an upper side thereof, and the protrusion is provided with a mounting slot for receiving the first end of the adjusting lever;
the angle positioning mechanism further includes a spring mounted in the central hole and made contact with the top bead; and a push rod configured to be in contact with the spring; and
the adjusting lever is connected to the protrusion by a bolt, and a portion of the bolt extending into the central hole of the adjusting lever is configured to be in contact with the push rod.

For example, the base is provided with a groove for receiving tooth portions of the first toothed member and the second toothed member; the angle adjustment tool further includes an upper base connected to the base and covering the groove, and the index plate is disposed on a surface of the upper base.

For example, the index plate is integrally formed with the upper base, and/or the rotating scale is integrally formed with the second toothed member.

For example, the pitch circle diameter of the second toothed portion is 5 or 10 times the pitch circle diameter of the first toothed portion.

For example, a rubber pad is provided on a fitting side of the rotating scale.

In another aspect, the present disclosure relates to an angle adjustment system for a liquid crystal panel, comprising the above-described angle adjusting tool.

In further another aspect, the present disclosure relates to a line defect analysis method for a liquid crystal panel using the above-described angle adjustment system for the liquid crystal panel, comprising steps of:

step 1: lighting and observing a liquid crystal panel to be inspected;

step 2: measuring and obtaining coordinates of the liquid crystal panel for patrol line tracing under a lighting machine;

step 3: adjusting the rotating scale of the angle adjustment system for the liquid crystal panel to a corresponding angle according to the coordinates measured and obtained in the step 2;

step 4: fitting an edge of the liquid crystal panel with the rotating scale, tracing the coordinates measured and obtained in the step 2 along a line by a microscope and analyzing line defects of the liquid crystal panel.

BRIEF DESCRIPTION OF THE DRAWINGS

Other features and advantages of embodiments of the present disclosure will be apparent upon reading the following detailed description with reference to the accompanying drawings, in which.

DETAILED DESCRIPTION OF PREFERRED EMBODIMENTS

Figure 1:
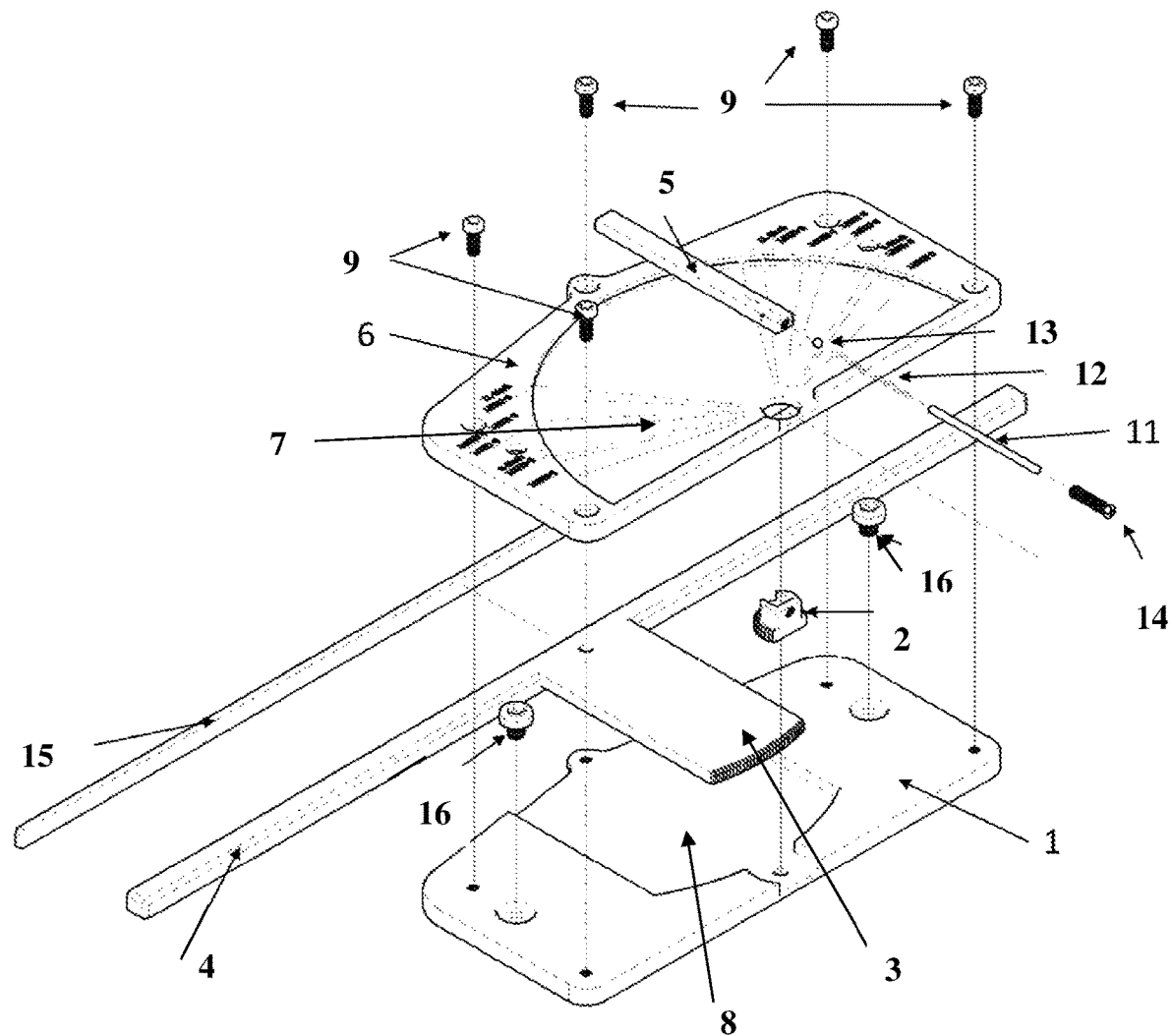
FIG. 1 is a schematic exploded view of an angle adjustment tool for a TFT-LCD defect analysis according to an embodiment of the present disclosure.
Figure 2:
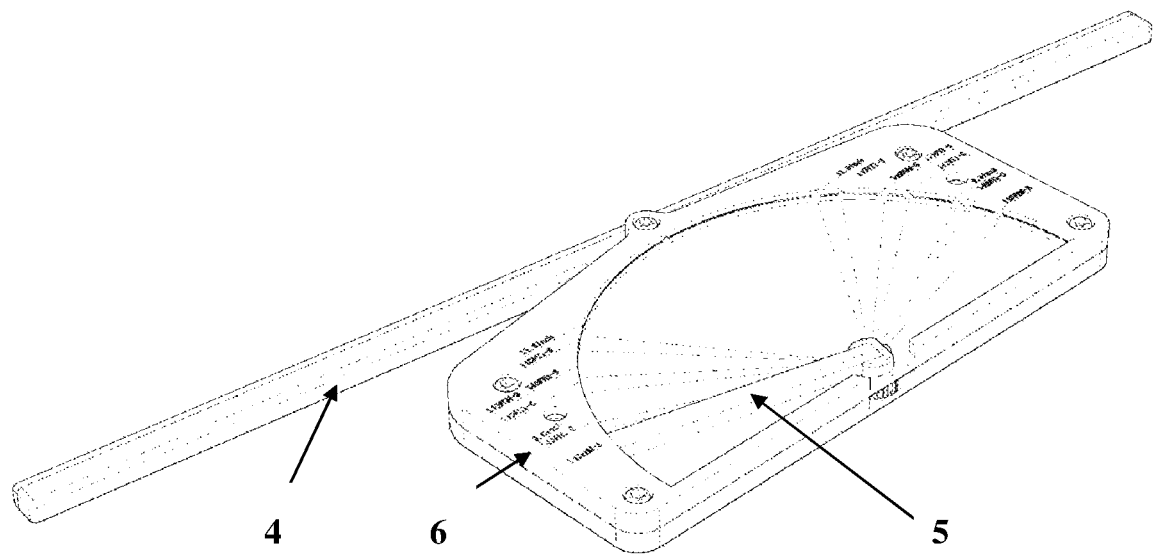
FIG. 2 is a perspective view of an angle adjustment tool for a TFT-LCD defect analysis according to an embodiment of the present disclosure.
Figure 3:
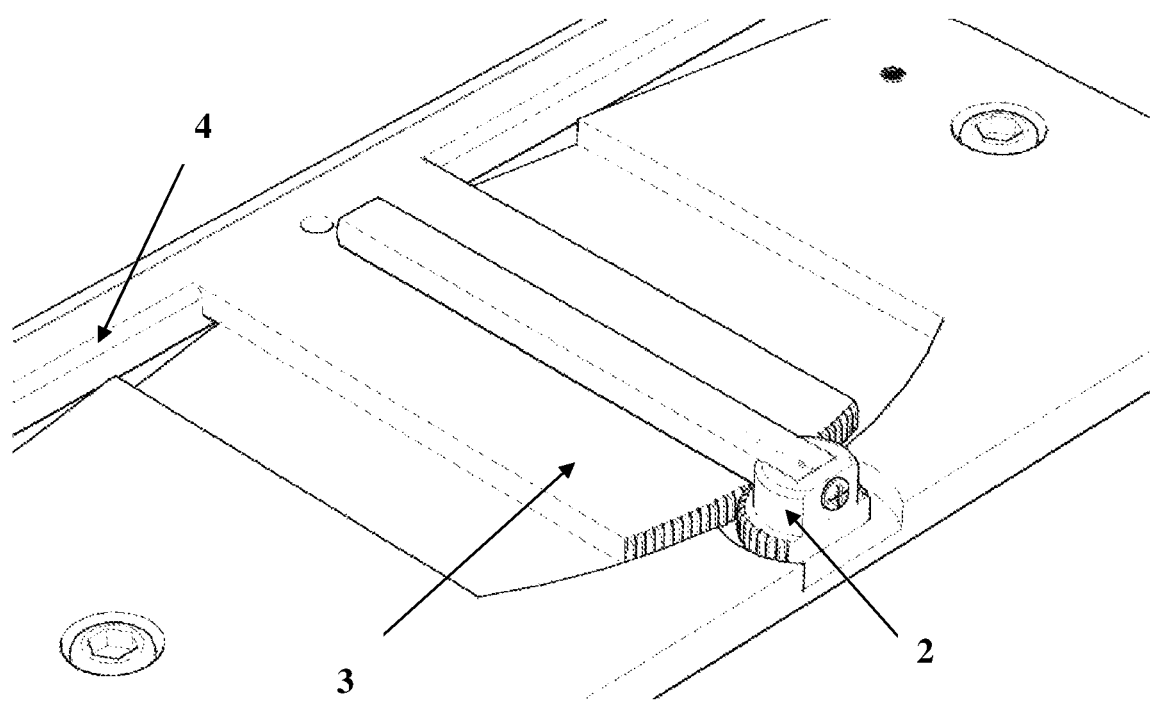
FIG. 3 is an enlarged view of a gear engagement mechanism of an angle adjustment tool for a TFT-LCD defect analysis according to an embodiment of the present disclosure.
Figure 4:
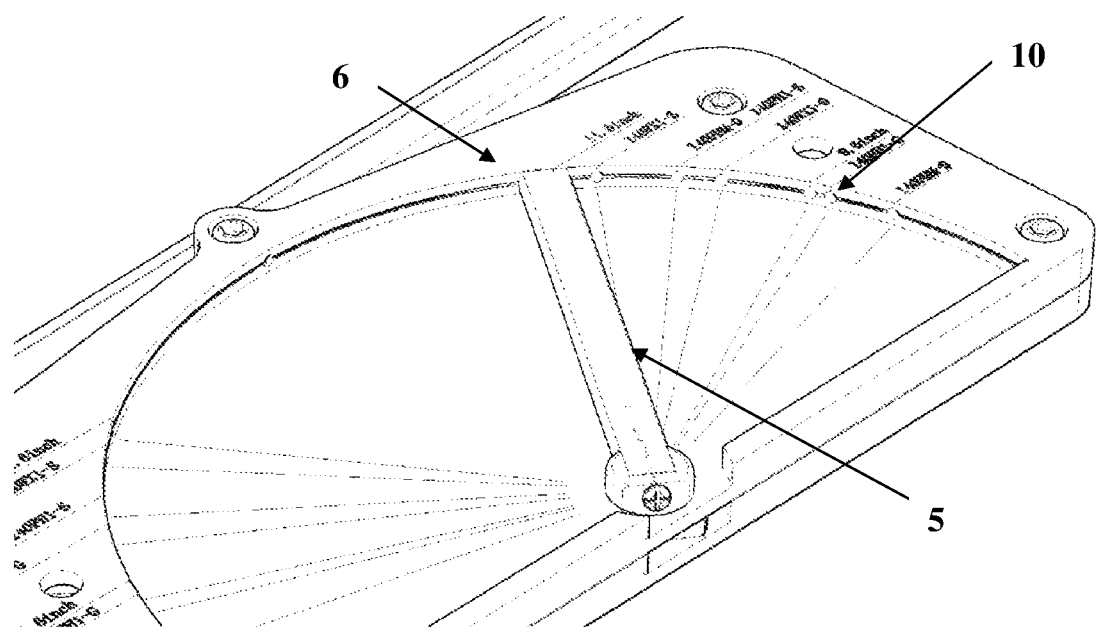
FIG. 4 is a working schematic view of a positioning mechanism of an angle adjustment tool for a TFT-LCD defect analysis according to an embodiment of the present disclosure.

Hereinafter, the embodiments of the present disclosure will be described in detail with reference to the drawings and examples. It should be noted that the embodiments of the present disclosure and the features in the embodiments may be combined with each other without conflict.

It will be appreciated that the directional terms "center", "longitudinal", "traversal", "upper", "lower", "front", "rear", "left", "right", "vertical", "horizontal", "top", "bottom", "inner", "outer" and the like are cited based on the illustrated orientation or positional relationship. They are only used to facilitate describing the embodiments of the present disclosure and simplifying the description, but not to indicate or imply that the device or component in question must have a particular orientation, or be constructed or operated in a particular orientation, and thus it should not be construed as limiting the embodiments of the present disclosure.

In the description of the embodiments of the present disclosure, it should be noted that the terms "mount", "connect" and "join" should be broadly understood unless explicitly defined or limited otherwise. For example, they may be a fixed connection, a detachable connection, or an integral connection; or they may be a mechanical connection, or an electrical connection; or they may be a direct connection, or an indirect connection through an intermediate medium, or an internal communication between two components. For those skilled in the art, the specific meanings of the above terms in the embodiments of the present disclosure may be understood based on specific situations.

In the line defect analysis process, the following three steps are typically used: ① lighting and observing phenomenon; ② measuring and obtaining coordinates by a lighting machine; and ③ observing and analyzing by a microscope. However, after measuring and obtaining the coordinates and when observing by a microscope, since the coordinate lines inside the liquid crystal panel are not evenly distributed and have angles, it is often necessary to find coordinate position before observing along a line when bad coordinates need to be traced and analyzed along a line by a microscope.

Due to the different angles of the coordinate lines inside the different models of liquid crystal panels, it is also necessary to adjust the angle of the liquid crystal panel before patrolling the lines so that a target line matches with a reference line of the microscope. However, due to large manual operation error, the target line is often lost during the actual line patrol when the angle is adjusted manually. As a result, some line defects cannot be found in time and results of the analysis are adversely affected. Furthermore, when the angle is adjusted manually, a surface of the liquid crystal panel frequently rubs with the microscope platform, which may easily cause scratches of an outside of a polarizer of the liquid crystal panel, resulting in secondary defects and increasing costs. In addition, once the line defects present at high incidence, (e.g., the liquid crystal panels of various models have line defects at the same time), the method in which the angle is adjusted manually is extremely inefficient and poor products cannot be analyzed one by one in a limited time, which impacts the summary of defects.

Therefore, the embodiments of the present disclosure provide a solution which can allow the coordinate line of the liquid crystal panel to be inspected to match the reference line of the microscope quickly, and improve the efficiency of the error analysis.

Through measuring and obtaining angle of the coordinate lines of different models of products and distinguishing their ranges, embodiments of the present disclosure propose an angle adjustment tool or an angle selecting tool.

FIGS. 1 to 4 show an angle adjustment tool for a TFT-LCD defect analysis according to an optional embodiment of the present disclosure. In FIG. 1, a schematic exploded view of the angle adjustment tool is particularly shown. The angle adjustment tool includes a base 1, on which a first toothed member 2 and a second toothed member 3, engaged with the first toothed member 2, are disposed. The first toothed member 2 may be manually dialed to adjust rotation angles of the first toothed member 2 and the second toothed member 3. The second toothed member 3 is fixedly connected with a rotating scale 4 configured to be fitted with an edge of a liquid crystal panel to be analyzed so as to implement a line defect analysis to the liquid crystal panel. The rotation of the first toothed member 2 drives the second toothed member 3 to rotate, and the second toothed member 3 further drives the rotating scale 4 to rotate, so that the angle of the liquid crystal panel whose edge is fitted with the rotating scale 4 changes. Therefore, a direction of a coordinate to be measured in the liquid crystal panel is adjusted accordingly.

In the optional embodiment in FIG. 1, the first toothed member 2 may be partially formed by a first toothed portion, and the first toothed member 2 pivots about a central pivot axis of the first toothed portion. However, it is conceivable that the first toothed member can also be completely formed by a complete first toothed portion. While the second toothed member 3 engaged with the first toothed member 2 may be partially constituted by a second toothed portion such that a first end of the second toothed member 3 is formed with a toothed portion and a second end opposite to the first end is adapted to be fixedly connected to the rotating scale 4. In the optional embodiment shown in the figures, the second toothed member 3 is formed in one piece with the rotating scale 4, and it is conceivable that the rotating scale 4 may also be connected to the second toothed member 3 with a fastener such as bolt. The second toothed member 3 pivots about a central pivot axis of the second toothed portion. In the illustrated embodiment, the second toothed member 3 has a generally rectangular shape, the second toothed member 3 and the rotating scale 4 form a substantially "T" shape, and it is conceivable that the second toothed member 3 may take other shapes, such as a generally sectorial shape.

It will be understood that, by means of the engagement between the first toothed member 2 and the second toothed member 3, the rotation of a predetermined angle of the first toothed member 2 causes the second toothed member 3 to drive the rotating scale 4 to rotate by a predetermined angle. It can be seen from the figures that a pitch circle diameter of the second toothed portion is much greater than a pitch circle diameter of the first toothed portion in this embodiment. The process of rotating the first toothed member 2 functions as magnifying the rotation angle of rotating scale 4, which facilitates an accurate control of the rotation angle of the rotating scale 4, thereby magnifying the angle of the measured coordinates in the liquid crystal panel. In an optional embodiment, the pitch circle diameter of the second toothed portion is an appropriate integer, for example 5 or 10, times the pitch circle diameter of the first toothed portion, thereby the rotation angle of the rotating scale is magnified by an integer number of times, so as to facilitate the calculation. Although the second toothed member 3 is directly engaged with the first toothed member 2 in the illustrated embodiment, it is conceivable that there are multiple transmission components to be connected between the second toothed member 3 and the first toothed member 2 for multi-stage magnification. Through the multi-stage magnification function, a sensitive reaction to changes of tiny angles (that is, tiny rotation angles of the rotating scale) can be realized, thereby a slight adjustment of the angle of the liquid crystal panel is realized. In consideration that the coordinate lines inside the liquid crystal panel have smaller angle, in order to improve the accuracy, the magnifying device with toothed portion is innovatively designed. That is, the pitch circle diameter of the toothed portion of the second toothed member 3 is equal to or more than 5 times that of the toothed portion of the first toothed member 2, so as to achieve a high degree of magnification of angle of coordinate lines of the liquid crystal panel. Also, it can magnify small changes of the angle.

It is conceivable that the first toothed member 2 is small due to the smaller angle of the first toothed portion, therefore it is not very easy to rotate the first toothed member 2 directly by hand. Thus, in an optional embodiment, the first toothed member 2 is fixedly connected with a rotary adjusting lever 5 of a larger size. The rotary adjusting lever 5 is long with respect to the size of the first toothed member 2. In this way, not only the rotation of the first toothed member 2 can be easily performed by operating the rotary adjusting lever 5, but also a rotation degree can be indicated by rotating the rotary adjusting lever 5.

Figure 5:
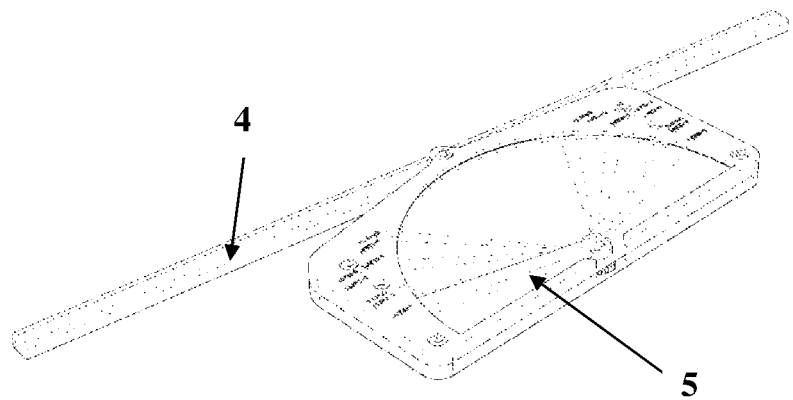
FIG. 5 is a schematic view showing a first use state of an angle adjustment tool for a TFT-LCD defect analysis according to an embodiment of the present disclosure (in which a rotating scale rotates clockwise by 7.5° for 14.0 HADS product analysis)
Figure 6:
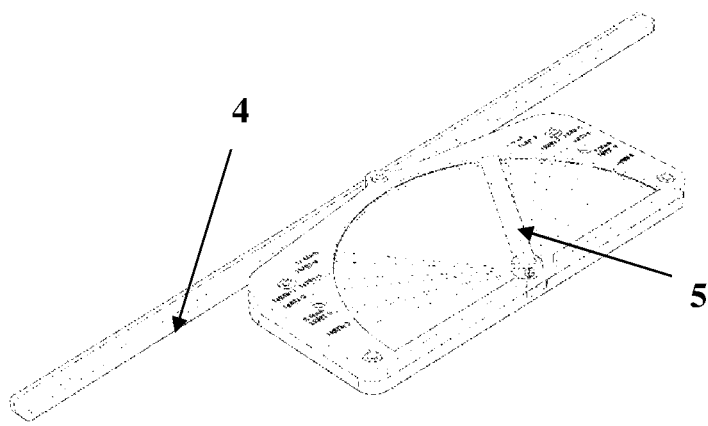
FIG. 6 is a schematic view showing a second use state of an angle adjustment tool for a TFT-LCD defect analysis according to an embodiment of the present disclosure (in which a rotating scale rotates counterclockwise by 3.5° for 11.6 inch product analysis).

In order to more easily control the rotation angle of the rotating scale 4, the angle adjustment tool further includes an index plate 6 for distinguishing scale, and the index plate 6 includes a sectorial recess for receiving the rotary adjusting lever 5. The end of the rotary adjusting lever 5 points to the scale on the index plate 6, and the index plate 6 indicates the rotation angle of the rotating scale 4. For a particular model of liquid crystal panel, the angle of the line to be patrolled is generally fixed. Therefore, in addition to the specific rotation angle marked on the index plate 6, the model and the like of the product corresponding to the angle can also be marked. This makes it easy, fast and accurate to make adjustment for a particular type of liquid crystal panel. For example, FIGS. 5 and 6 respectively illustrate views, in which the rotary adjusting lever 5 points to different scales of the index plate, for two different types of liquid crystal panel. For example, FIG. 5 shows a state diagram for 14.0 HADS liquid crystal panel product analysis, in which the rotating scale 4 is rotated clockwise by 7.5°. For example, FIG. 6 shows a state diagram for 11.6 inch liquid crystal panel product analysis, in which the rotating scale 4 is rotated counterclockwise by 3.5° (where a 0° direction of the rotating scale 4 is defined as being parallel to a longitudinal axis of the base 1).

As shown in the figures, the angle adjustment tool according to the embodiment of the present disclosure may further include an upper base 7 covering the tooth portions of the first toothed member 2 and the second toothed member 3. In the illustrated configuration, a groove 8 is provided in the base 1 for receiving the first toothed member 2 and the second toothed member 3, the upper base 7 covers the groove of the base 1 that receives the first toothed member 2 and the second toothed member 3. It is conceivable that no groove is provided in the base 1, instead, a receiving portion for receiving the first toothed member 2 and the second toothed member 3 is provided in the upper base 7. The base 1 together with the upper base 7 enclose the teeth of the first toothed member 2 and the second toothed member 3, which facilitates dust prevention and protection of the teeth of the first toothed member 2 and the second toothed member 3. The index plate 6 is located on the surface of the upper base 7. The upper base 7 and the base 1 are fixed by screws 9. In the illustrated embodiment, the upper base 7 and the index plate 6 are formed in one piece, and it is conceivable that the upper base 7 and the index plate 6 can also be separately formed and the index plate 6 is fastened on the upper base 7 by a fastening member. The rotary adjusting lever 5 is rotated in a recess of the upper base 7 whose surface is recessed with respect to the index plate 6, and a distal end of the rotary adjusting lever 5 is directed to the scale on the index plate 6.

The upper base 7 may be not provided, and it is also possible to directly dispose the index plate 6. In this case, the index plate 6 is directly fixed on the base 1.

In order to fix the direction of the rotating scale 4 and to prevent the rotating scale from rotating during the measurement and thereby to prevent the liquid crystal panel to be inspected from rotating, the angle adjustment tool according to the embodiment of the present disclosure is provided with an angle fixing mechanism for fixing the first toothed member 2. For example, the angle fixing mechanism directly fixes the rotary adjusting lever 5 to fix the first toothed member 2 and further the rotating scale 4. More specifically, in the optional embodiment in which an index plate 6 is provided, the fixing mechanism is configured as follows: the rotary adjusting lever 5 has a central hole; the angle positioning mechanism includes: a plurality of positioning holes 10 arranged on a circumferential side wall of the sectorial recess of the index plate 6; and a top bead 13 mounted in the central hole of the rotary adjusting lever 5 and elastically abutting against the circumferential side wall of the sectorial recess. The positioning hole 10 can be elastically and detachably connected with the top bead 13. Specifically, the rotary adjusting lever 5 is a hollow level, in which a push rod 11, a spring 12 and a top bead 13 are sequentially arranged along a direction pointing to the edge of the index plate 6. The top bead 13 extends beyond the central hole of the rotary adjusting lever 5, but cannot slide out of the central hole, that is, a diameter of the top bead 13 is slightly greater than a diameter of the central hole. The top bead 13 can be embedded into the positioning hole 10 of the index plate 6 under a spring force of the spring 12 to achieve positioning, and it can be disengaged from the positioning hole 10 against the spring force by an external force (a force provided manually to rotate the rotary adjusting lever 5). The push rod 11 is fixed to the first toothed member 2 by a bolt 14. In the illustrated embodiment, the first toothed member 2 is provided with a raised protrusion that protrudes from the tooth portion. In the case where the upper base 7 is provided, the protrusion protrudes from the upper base. The push rod 11 is connected to the first toothed member 2 in the protrusion, and the hollow housing of the rotary adjusting lever 5 is connected between the push rod 11 and the top bead 13. It is conceivable to provide a rotary positioning mechanism or other types of fixing structures that directly fixes the first toothed member 2.

Although the angles of the coordinate lines inside the liquid crystal panel are complicated, they have a certain rule. That is, for a certain model of products, the angle of the coordinate line is a determined value and the distribution thereof presents periodicity and symmetry. Therefore, optionally, different models of the corresponding products to be inspected can also be directly marked on the index plate so as to make the positioning easier.

In order to prevent scratching a filter of the liquid crystal panel during the contact of the rotating scale 4 with the liquid crystal panel, a rotating scale rubber pad 15 is provided on a side of the rotating scale 4 that is in contact with the liquid crystal panel. However, it is conceivable for the entire surface of the rotating scale 4 to be coated with a flexible layer.

The angle adjustment tool can be fixed on the microscope platform by using a fastener such as a bolt 16 to prevent the angle adjustment tool from moving relative to the microscope.

The process for performing a line defect analysis using the angle adjustment tool according to an optional embodiment of the present disclosure as illustrated are as follows:

step 1: lighting and observing a liquid crystal panel to be inspected;

step 2: measuring and obtaining coordinates of the liquid crystal panel for patrol line tracing under a lighting machine;

step 3: rotating the rotary adjusting lever 5 to an angle mark corresponding to the liquid crystal panel to be inspected, embedding the steel bead 13 in the positioning mechanism into the positioning hole in the index plate 6 for positioning;

step 4: fitting an edge of the liquid crystal panel with the rotating scale 4, tracing the coordinates measured and obtained in the step 2 along a line by a microscope and analyzing line defects of the liquid crystal panel.

The above embodiments are merely exemplary embodiments of the present disclosure, which are not intended to limit the present disclosure, and the scope of the present disclosure is defined by the claims. Various modifications or equivalent replacements may be made to the present disclosure by those skilled in the art within the essential scope of the present disclosure, and such modifications or equivalent substitutions should also be considered as falling within the scope of the present disclosure.

What is claimed is:

1. An angle adjustment system for a liquid crystal panel, comprising an angle adjusting tool, wherein the angle adjustment tool comprises:
   a base;
   a first toothed member disposed on the base and a second toothed member engaged with the first toothed member;
   a rotating scale fixedly connected to the second toothed member; and
   an angle indicator connected to the first toothed member for indicating a rotation angle of the rotating scale,
   wherein the first toothed member comprises a first toothed portion and the first toothed member is pivotable about a central pivot axis of the first toothed portion;
   wherein the second toothed member comprises a second toothed portion, a first end of the second toothed member has the second toothed portion and engages with the first toothed portion of the first toothed member, and a second end of the second toothed member is connected to the rotating scale;
   wherein the second toothed member is pivotable about a central pivot axis of the second toothed portion; and
   wherein a pitch circle diameter of the second toothed portion is n times a pitch circle diameter of the first toothed portion, where n is a positive integer greater than or equal to 2.

2. A line defect analysis method using the angle adjustment system for the liquid crystal panel according to claim 1, comprising steps of:
   step 1: lighting and observing the liquid crystal panel;
   step 2: measuring and obtaining coordinates of the liquid crystal panel for patrol line tracing under a lighting machine;
   step 3: adjusting the rotating scale of the angle adjustment system for the liquid crystal panel to a corresponding angle according to the coordinates measured and obtained in the step 2; and
   step 4: fitting an edge of the liquid crystal panel with the rotating scale, tracing the coordinates measured and obtained in the step 2 along a line by a microscope and analyzing line defects of the liquid crystal panel.

3. The angle adjustment system according to claim 1, wherein an index plate having an angular scale is disposed above the base, wherein the angle indicator is an adjusting lever, and wherein a first end of the adjusting lever is connected to the first toothed member and a second end of the adjusting lever is configured to indicate the angular scale on the index plate.

4. The angle adjustment system according to claim 3, further comprising an angle positioning mechanism for positioning a rotation angle of the rotating scale.

5. The angle adjustment system according to claim 4, wherein the index plate is provided with a sectorial recess for rotation of the adjusting lever.

6. The angle adjustment system according to claim 5, wherein the adjusting lever has a central hole, and wherein the angle positioning mechanism comprises:
   a positioning hole arranged along a circumferential side wall of the sectorial recess; and
   a top bead mounted in the central hole and elastically abutting against the circumferential side wall of the sectorial recess.

7. The angle adjustment system according to claim 6, wherein:
   a protrusion for mounting the adjusting lever is provided in the first toothed member at an upper side thereof, and the protrusion is provided with a mounting slot for receiving the first end of the adjusting lever;
   the angle positioning mechanism further comprises a spring mounted in the central hole and made contact with the top bead, and a push rod configured to be in contact with the spring; and the adjusting lever is connected to the protrusion by a bolt, and wherein a portion of the bolt extending into the central hole of the adjusting lever is configured to be in contact with the push rod.

8. The angle adjustment system according to claim 7, wherein the base is provided with a groove for receiving tooth portions of the first toothed member and the second toothed member, wherein the angle adjustment tool further comprises an upper base connected to the base and covering the groove, and wherein the index plate is disposed on a surface of the upper base.

9. A line defect analysis method using the angle adjustment system for the liquid crystal panel according to claim 7, comprising steps of:
- step 1: lighting and observing the liquid crystal panel;
- step 2: measuring and obtaining coordinates of the liquid crystal panel for patrol line tracing under a lighting machine;
- step 3: adjusting the rotating scale of the angle adjustment system for the liquid crystal panel to a corresponding angle according to the coordinates measured and obtained in the step 2; and
- step 4: fitting an edge of the liquid crystal panel with the rotating scale, tracing the coordinates measured and obtained in the step 2 along a line by a microscope and analyzing line defects of the liquid crystal panel.

10. The angle adjustment system according to claim 6, wherein the base is provided with a groove for receiving tooth portions of the first toothed member and the second toothed member, wherein the angle adjustment tool further comprises an upper base connected to the base and covering the groove, and wherein the index plate is disposed on a surface of the upper base.

11. A line defect analysis method using the angle adjustment system for the liquid crystal panel according to claim 6, comprising steps of:
- step 1: lighting and observing the liquid crystal panel;
- step 2: measuring and obtaining coordinates of the liquid crystal panel for patrol line tracing under a lighting machine;
- step 3: adjusting the rotating scale of the angle adjustment system for the liquid crystal panel to a corresponding angle according to the coordinates measured and obtained in the step 2; and
- step 4: fitting an edge of the liquid crystal panel with the rotating scale, tracing the coordinates measured and obtained in the step 2 along a line by a microscope and analyzing line defects of the liquid crystal panel.

12. The angle adjustment system according to claim 5, wherein the base is provided with a groove for receiving tooth portions of the first toothed member and the second toothed member, wherein the angle adjustment tool further comprises an upper base connected to the base and covering the groove, and wherein the index plate is disposed on a surface of the upper base.

13. A line defect analysis method using the angle adjustment system for the liquid crystal panel according to claim 5, comprising steps of:
- step 1: lighting and observing the liquid crystal panel;
- step 2: measuring and obtaining coordinates of the liquid crystal panel for patrol line tracing under a lighting machine;
- step 3: adjusting the rotating scale of the angle adjustment system for the liquid crystal panel to a corresponding angle according to the coordinates measured and obtained in the step 2; and
- step 4: fitting an edge of the liquid crystal panel with the rotating scale, tracing the coordinates measured and obtained in the step 2 along a line by a microscope and analyzing line defects of the liquid crystal panel.

14. The angle adjustment system according to claim 4, wherein the base is provided with a groove for receiving tooth portions of the first toothed member and the second toothed member, wherein the angle adjustment tool further comprises an upper base connected to the base and covering the groove, and wherein the index plate is disposed on a surface of the upper base.

15. A line defect analysis method using the angle adjustment system for the liquid crystal panel according to claim 4, comprising steps of:
- step 1: lighting and observing the liquid crystal panel;
- step 2: measuring and obtaining coordinates of the liquid crystal panel for patrol line tracing under a lighting machine;
- step 3: adjusting the rotating scale of the angle adjustment system for the liquid crystal panel to a corresponding angle according to the coordinates measured and obtained in the step 2; and
- step 4: fitting an edge of the liquid crystal panel with the rotating scale, tracing the coordinates measured and obtained in the step 2 along a line by a microscope and analyzing line defects of the liquid crystal panel.

16. The angle adjustment system according to claim 3, wherein the base is provided with a groove for receiving tooth portions of the first toothed member and the second toothed member, wherein the angle adjustment tool further comprises an upper base connected to the base and covering the groove, and wherein the index plate is disposed on a surface of the upper base.

17. The angle adjustment system according to claim 16, wherein the index plate is integrally formed with the upper base, and/or the rotating scale is integrally formed with the second toothed member.

18. A line defect analysis method using the angle adjustment system for the liquid crystal panel according to claim 3, comprising steps of:
- step 1: lighting and observing the liquid crystal panel;
- step 2: measuring and obtaining coordinates of the liquid crystal panel for patrol line tracing under a lighting machine;
- step 3: adjusting the rotating scale of the angle adjustment system for the liquid crystal panel to a corresponding angle according to the coordinates measured and obtained in the step 2; and
- step 4: fitting an edge of the liquid crystal panel with the rotating scale, tracing the coordinates measured and obtained in the step 2 along a line by a microscope and analyzing line defects of the liquid crystal panel.

19. The angle adjustment system according to claim 1, wherein the pitch circle diameter of the second toothed portion is 5 or 10 times the pitch circle diameter of the first toothed portion.

20. The angle adjustment system according to claim 1, wherein a rubber pad is provided on a fitting side of the rotating scale.

* * * * *